(12) United States Patent
Park et al.

(10) Patent No.: US 9,006,713 B2
(45) Date of Patent: Apr. 14, 2015

(54) ORGANIC LIGHT-EMITTING DISPLAY APPARATUS

(75) Inventors: Jin-Woo Park, Yongin (KR);
Myung-Jong Jung, Yongin (KR);
Sung-Woo Cho, Yongin (KR);
Sang-Woo Pyo, Yongin (KR); Hyo-Yeon Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 426 days.

(21) Appl. No.: 13/450,363

(22) Filed: Apr. 18, 2012

(65) Prior Publication Data
US 2013/0001531 A1    Jan. 3, 2013

(30) Foreign Application Priority Data
Jun. 30, 2011 (KR) .................. 10-2011-0065138

(51) Int. Cl.
| H01L 29/08 | (2006.01) |
| H01L 35/24 | (2006.01) |
| H01L 51/00 | (2006.01) |
| H01L 51/50 | (2006.01) |
| H01L 27/32 | (2006.01) |

(52) U.S. Cl.
CPC .......... *H01L 51/504* (2013.01); *H01L 27/3211* (2013.01)

(58) Field of Classification Search
USPC .................. 257/40, 97; 313/498, 504
See application file for complete search history.

(56) References Cited

U.S. PATENT DOCUMENTS

| 2003/0059647 A1 | 3/2003 | Thompson et al. |
| 2004/0032214 A1 | 2/2004 | Lee et al. |
| 2005/0142384 A1 | 6/2005 | Itai |
| 2005/0186330 A1 | 8/2005 | Kim et al. |
| 2006/0251924 A1* | 11/2006 | Lu et al. .................. 428/690 |
| 2007/0046185 A1* | 3/2007 | Kim .................. 313/504 |
| 2007/0298263 A1 | 12/2007 | Tonotani et al. |
| 2010/0052522 A1* | 3/2010 | Kim et al. .................. 313/504 |
| 2010/0224863 A1* | 9/2010 | Minagawa .................. 257/40 |
| 2011/0240970 A1 | 10/2011 | Park et al. |

FOREIGN PATENT DOCUMENTS

| KR | 10-2003-0015611 A | 2/2003 |
| KR | 10-2004-0070171 A | 8/2004 |
| KR | 10-2004-0104225 A | 12/2004 |
| KR | 10-2005-0082644 A | 8/2005 |
| KR | 10-2006-0002730 A | 1/2006 |
| KR | 10-2007-0096760 A | 10/2007 |
| KR | 10-2009-0116091 A | 11/2009 |
| KR | 10-2011-0109559 A | 10/2011 |

\* cited by examiner

*Primary Examiner* — Errol Fernandes
(74) *Attorney, Agent, or Firm* — Knobbe Martens Olson & Bear LLP

(57) ABSTRACT

In one aspect, an organic light-emitting display apparatus is provided including a first sub-pixel, a second sub-pixel, and a third sub-pixel that are each a different color, the apparatus including: a substrate; a first electrode disposed on the substrate; a second electrode disposed on the first electrode so as to face the first electrode; an organic emission layer disposed between the first electrode and the second electrode and comprising a first organic emission layer, a second organic emission layer, and a third organic emission layer; a hole transport layer disposed between the first electrode and the organic emission layer; and an electron accepting layer disposed between the first electrode and the second electrode. The organic light-emitting display apparatus has improved image quality and lifetime.

18 Claims, 2 Drawing Sheets

ORGANIC LIGHT-EMITTING DISPLAY APPARATUS

CROSS-REFERENCE TO RELATED APPLICATION

This application claims priority to and the benefit of Korean Patent Application No. 10-2011-0065138, filed in the Korean Intellectual Property Office on Jun. 30, 2011, the disclosure of which is incorporated herein by reference in its entirety.

BACKGROUND

1. Field

The described technology generally relates to an organic light-emitting display apparatus, and more particularly, to an organic light-emitting display apparatus having low driving voltage and improved image quality and lifetime.

2. Description of the Related Technology

Portable thin flat panel display apparatuses have been used as a replacement for display apparatuses. An organic or inorganic light-emitting display apparatus, a type of thin flat panel display apparatus, is a self-emission display apparatus. The organic or inorganic light-emitting display apparatus may have a wide view angle, excellent contrast, and quick response speeds. Also, an organic light-emitting display apparatus, in which a light emitting layer is formed of an organic material, may have excellent luminance, driving voltage, and response speed, as compared to an inorganic light-emitting display apparatus. Additionally, an organic light-emitting display apparatus may display multi-colors.

In an organic light-emitting display apparatus, an organic emission layer may be interposed between a cathode and an anode, and, when a voltage is applied to the cathode and the anode, the organic emission layer connected to the cathode and the anode emits visible light.

The organic emission layer may include an organic emission layer emitting different colors of visible light such as red, green, or blue. In the organic emission layer, holes and electrons are recombined, thereby emitting visible light. However, surplus electrons that do not participate in the recombination move toward a hole injection layer (HIL), a hole transport layer (HTL) or a first electrode, thereby resulting in deterioration of light efficiency and life of an organic light-emitting display apparatus.

In particular, in a structure in which a blue organic emission layer is commonly used in all sub-pixels, the surplus electrons generate visible light in a different organic emission layer, and thus color mixture occurs, thereby resulting in deterioration of image quality. Therefore, difficulty exists when trying to improve the image quality.

An organic emission layer may be directly patterned to different thicknesses by laser induced thermal imaging (LITI). In detail, a donor film including a light-to-heat conversion layer (LTHC) and a transfer layer is aligned on an organic emission layer as a receptor and attached thereto, and laser beams then irradiate the donor film, thereby completing the patterning process. When the organic emission layer is formed by LITI, the formation of the organic emission layer does not require a separate chemical treatment process and thus the organic emission layer is not damaged and manufacturing processes are simplified as compared to the photolithography method. However, in a transfer mechanism, only a donor film is not transferred by laser irradiation and the laser beams need to be irradiated up to portions disposed below the donor film to perform the transfer process. Thus, if the thickness of organic emission layer to be substantially transferred increases, more energy necessary for the donor film through layers deposited below the donor film and on a substrate is consumed. Such an excessive energy may incur thermal degradation of organic materials constituting the organic emission layer, thereby deteriorating the characteristics of an organic light-emitting device.

SUMMARY

The present embodiments provide an organic light-emitting display apparatus having a low driving voltage and improved image quality and lifetime.

According to an aspect of the present embodiments, there is provided an organic light-emitting display apparatus including a first sub-pixel, a second sub-pixel, and a third sub-pixel that are different in color from each other, the apparatus including: a substrate; a first electrode disposed on the substrate; a second electrode disposed on the first electrode so as to face the first electrode; an organic emission layer disposed between the first electrode and the second electrode and comprising a first organic emission layer, a second organic emission layer, and a third organic emission layer; a hole transport layer disposed between the first electrode and the organic emission layer; and an electron accepting layer disposed between the first electrode and the second electrode so as to contact the organic emission layer, wherein the first organic emission layer is disposed in the first sub-pixel, the second organic emission layer is disposed in the second sub-pixel, and the third organic emission layer is commonly disposed across all of the first sub-pixel, the second sub-pixel, and the third sub-pixel, wherein the electron accepting layer is disposed between the first organic emission layer and the third organic emission layer in the first sub-pixel and between the second organic emission layer and the third organic emission layer in the second sub-pixel, wherein the third organic emission layer comprises a first material having a hole transporting ability, a blue host, and a dopant.

In certain embodiments, the first organic emission layer may be configured to emit red visible light, the second organic emission layer may be configured to emit green visible light, and the third organic emission layer may be configured to emit blue visible light.

In certain embodiments, the electron accepting layer may include at least one component selected from the group consisting of 7,7,8,8-tetracyanoquinodimethane (TCNQ), tetrafluorotetracyanoquinodimethane (F4-TCNQ), hexaazatriphenylene hexacarbonitrile (HAT-CN), $MoO_3$, $V_2O_5$, $WO_3$, $SnO_2$, ZnO, $MnO_2$, $CoO_2$, $TiO_2$, and fullerene ($C_{60}$).

In certain embodiments, the electron accepting layer may have a thickness in a range of 10 Å to 100 Å.

In certain embodiments, the first material may include a hole transporting material.

In certain embodiments, the third organic emission layer may include 100 parts by weight of the first material, 10 to 100 parts by weight of the blue host, and 3 to 10 parts by weight of the dopant.

In certain embodiments, the hole transport layer may contact the third organic emission layer.

In certain embodiments, the hole transport layer may have a thickness in a range of 100 Å to 800 Å.

In certain embodiments, the third organic emission layer may be disposed between the first electrode and the first organic emission layer in the first sub-pixel and between the first electrode and the second organic emission layer in the second sub-pixel.

In certain embodiments, the organic light-emitting display apparatus may further include a buffer layer between the electron accepting layer and the first organic emission layer in the first sub-pixel and between the electron accepting layer and the second organic emission layer in the second sub-pixel.

In certain embodiments, the buffer layer may include a hole injection material or a hole transporting material.

In certain embodiments, the buffer layer may have a thickness in a range of 100 Å to 700 Å.

In certain embodiments, a hole injection layer may be disposed between the substrate and the hole transport layer.

In certain embodiments, the organic light-emitting display apparatus may further include an intermediate layer disposed between the hole injection layer and the hole transport layer.

In certain embodiments, the intermediate layer may include at least one component selected from the group consisting of 7,7,8,8-tetracyanoquinodimethane (TCNQ), tetrafluorotetracyanoquinodimethane (F4-TCNQ), hexaazatriphenylene hexacarbonitrile (HAT-CN), $MoO_3$, $V_2O_5$, $WO_3$, $SnO_2$, ZnO, $MnO_2$, $CoO_2$, $TiO_2$, and fullerene ($C_{60}$).

In certain embodiments, the intermediate layer may have a thickness in a range of 10 Å to 80 Å.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Structures and operations of organic light-emitting display apparatuses according to exemplary embodiments of the present embodiments will now be described in detail with reference to the accompanying drawings where like references numbers indicate identical or functionally similar elements. As used herein, the term "and/or" includes any and all combinations of one or more of the associated listed items.

Figure 1:
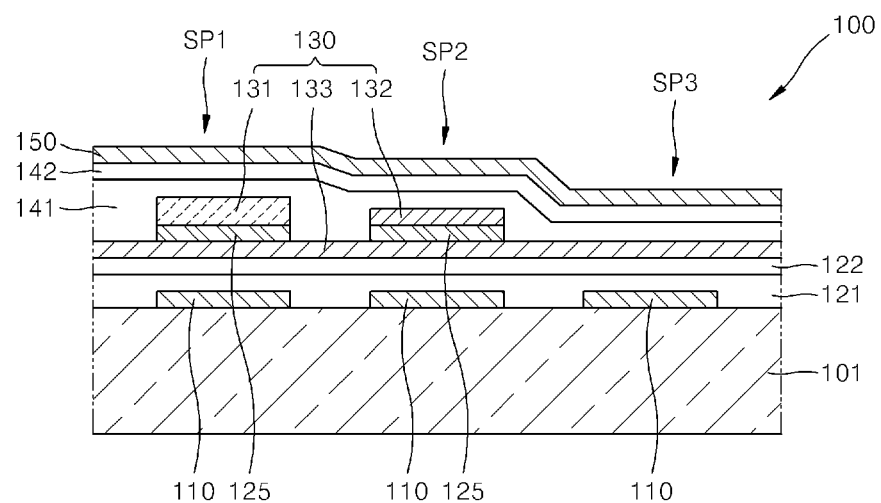
FIG. 1 is a schematic cross-sectional view of an organic light-emitting display apparatus according to an aspect of the present embodiments.

FIG. 1 is a schematic cross-sectional view of an organic light-emitting display apparatus 100 according to an aspect of the present embodiments.

The organic light-emitting display apparatus 100 includes a first sub-pixel SP1, a second sub-pixel SP2, and a third sub-pixel SP3. In certain embodiments, the sub-pixels SP1, SP2, and SP3 may be different in color. For example, the first sub-pixel SP1, the second sub-pixel SP2, and the third sub-pixel SP3 may be defined as a red sub-pixel, a green sub-pixel, and a blue sub-pixel, respectively.

Although one first sub-pixel SP1, one second sub-pixel SP2, and one third sub-pixel SP3 are illustrated in FIG. 1, this is only for convenience of explanation and not limited to the above example. For example, in certain embodiments, the organic light-emitting display apparatus 100 may include a plurality of first sub-pixels SP1, a plurality of second sub-pixels SP2, and a plurality of third sub-pixels SP3.

The first sub-pixel SP1 includes a first electrode 110, a hole transport layer (HTL) 122, a third organic emission layer 133, an electron accepting layer 125, a first organic emission layer 131, and a second electrode 150. The second sub-pixel SP2 includes a first electrode 110, the HTL 122, the third organic emission layer 133, an electron accepting layer 125, a second organic emission layer 132, and the second electrode 150. The third sub-pixel SP3 includes a first electrode 110, the HTL 122, the third organic emission layer 133, and the second electrode 150.

The form and structure of each element will now be described in more detail.

In certain embodiments, a substrate 101 may be formed of a transparent glass material consisting mainly of $SiO_2$. In certain embodiments, the substrate 101 may be formed of a transparent plastic material. In certain embodiments, the transparent plastic material may be an organic insulating material such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), or cellulose acetate propionate (CAP).

In certain embodiments, the substrate 101 may also be formed of a metal. In certain embodiments, the substrate 101 may include, but is not limited to, at least one of carbon (C), steel (Fe), chrome (Cr), manganese (Mn), nickel (Ni), titanium (Ti), molybdenum (Mo), stainless steel (SUS), an invar alloy, an inconel alloy, and a kovar alloy when the substrate 101 is formed of a metal. In certain embodiments, the substrate 101 may also be formed of a metal foil.

In certain embodiments, a passivation layer (not shown) may be formed on the substrate 101 so as to prevent impurities from permeating into the substrate 101. In certain embodiments, the passivation layer may be formed of $SiO_2$ and/or $SiN_x$.

In certain embodiments, the first electrode 110 may be formed in a predetermined pattern by photolithography. In certain embodiments, the first electrode 110 may be a reflective electrode or transparent electrode. When the first electrode 110 is a reflective electrode, the first electrode 110 may be formed such that a reflective layer is formed of one material selected from the group consisting of silver (Ag), magnesium (Mg), aluminum (Al), platinum (Pt), palladium (Pd), gold (Au), Ni, neodymium (Nd), iridium (Ir), Cr, lithium (Li), and calcium (Ca), and combinations thereof, and then ITO, IZO, ZnO or $In_2O_3$ having a high work function is disposed on the reflective layer. In certain embodiments, the first electrode 110 may be formed of ITO, IZO, ZnO or $In_2O_3$ having a high work function when the first electrode 110 is formed as a transparent electrode.

In certain embodiments, the first electrode 110 and the second electrode 140 may be an anode and a cathode, respectively, or vice versa.

In certain embodiments, a hoe injection layer (HIL) 121 and the HTL 122 are formed on the first electrode 110, but are not limited thereto. For example, only the HTL 122 may be disposed without the HIL 121, and a plurality of hole transport layers 122 may be disposed.

In certain embodiments, the HIL 121 may be formed of a known hole injection material. Examples of hole injection material includes, but is not limited to, a phthalocyanine compound such as copper phthalocyanine, 4,4',4"-Tris(N-3-methylphenyl-N-phenylamino)triphenylamine (m-MTDATA), 4,4',4"-tris(N,N-diphenyl-amino)-triphenylamine (TDATA), 4,4',4''-tris[2-naphthyl(phenyl)amino]triphenylamine (2-TNATA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS). In certain embodiments, the thickness of the HIL 121 may be in the range of about 300 Å to about 1,000 Å. When the thickness of the HIL 121 is within this range, satisfactory hole injection properties may be obtained without a substantial increase in driving voltage.

In certain embodiments, the HTL 122 may be formed of a known hole transporting material.

For example, the known hole transporting material may be TPD (refer to structure below) or NPB (refer to structure below), but is not limited thereto.

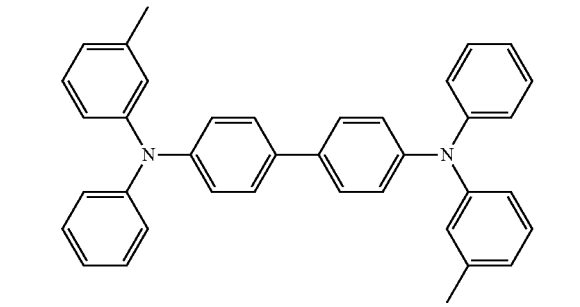

TPD

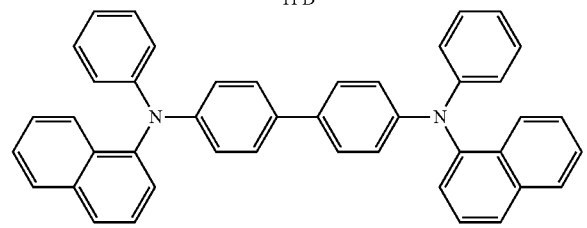

NPB

In certain embodiments, the thickness of the HTL 122 may be in the range of about 100 Å to about 800 Å. When the thickness of the HTL 122 is within this range, satisfactory hole transport properties may be obtained without a substantial increase in driving voltage.

FIG. 1 illustrates embodiments where organic emission layer 130 is formed on the HTL 122. The organic emission layer 130 includes a first organic emission layer 131, the second organic emission layer 132, and the third organic emission layer 133.

In particular, FIG. 1 illustrates an embodiment where the third organic emission layer 133 is formed on the HTL 122 completely across all of the first sub-pixel SP1, the second sub-pixel SP2, and the third sub-pixel SP3.

In certain embodiments, the third organic emission layer 133 may include a first material having a hole transporting ability, a blue host, and a dopant.

In certain embodiments, the first material may be a known hole transporting material. For example, the first material may be the same hole transporting material as that of the HTL 122.

Examples of the blue host include, but are not limited to, 4,4'-N,N'-dicabazole-biphenyl (CBP), 9,10-di(naphthalene-2-yl)anthracene (ADN), TPBI (refer to structure below), TBADN (refer to structure below), and E3 (refer to structure below).

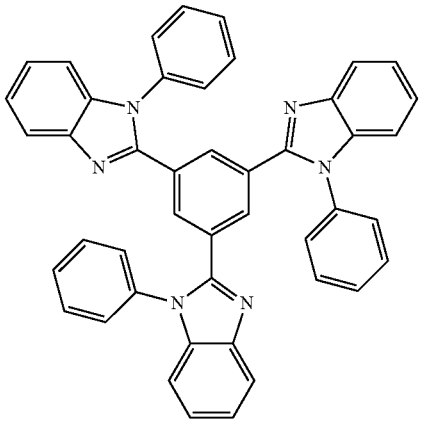

TPBI

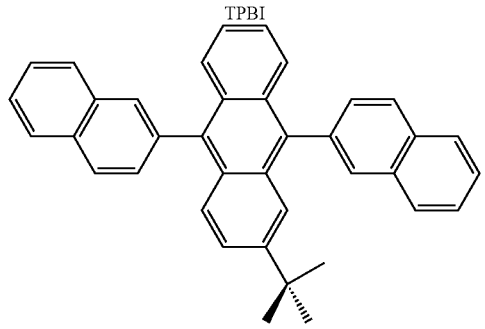

TBADN

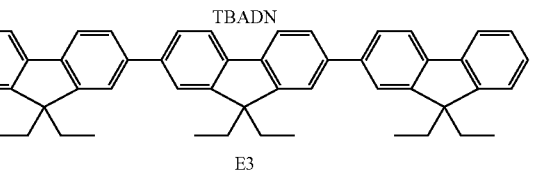

E3

In certain embodiments, the third organic emission layer 133 emits blue visible light and may include a blue light-emitting material such as oxadiazole dimer dyes (Bis-DAP-DXP), spiro compounds (Spiro-DPVBi, Spiro-6P), triarylamine compounds, bis(styryl)amine (DPVBi, DSA), 4,4'-bis(9-ethyl-3-vinylene)-1,1'-biphenyl (BCzVBi), perylene, 2,5,8,11-tetra-tert-butylperylene (TPBe), 9H-carbazole-3,3'-1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), or bis 3,5-difluoro-2-(2-pyridyl)phenyl-(2-carboxypyridyl)iridium III (FIrPic), and may further include a polymer light-emitting material such as a polyfluorene-based polymer or a polyvinyl-based polymer; however, the present invention is not limited thereto.

In certain embodiments, the third organic emission layer 133 may include 10 to 100 parts by weight of the blue host and 3 to 10 parts by weight of the dopant based on 100 parts by weight of the first material.

In certain embodiments, the third organic emission layer 133 may be formed as a common layer and includes the first material in addition to the blue host and the dopant and thus acts as an intermediate connector together with the HTL 122. When the amounts of the blue host and the dopant included in the third organic emission layer 133 are within the ranges described above, the third organic emission layer 133 may effectively act as an intermediate connector so that a bulk resistance of the third organic emission layer 133 formed as a common layer may be reduced. In addition, when the amounts of the blue host and the dopant included in the third organic emission layer 133 are within the ranges described above, concentration quenching may not occur.

In certain embodiments, the organic emission layer 130 may be formed such that the third organic emission layer 133 as a blue layer is formed as a common layer below the first organic emission layer 131 as a red layer and the second organic emission layer 132 as a green layer. Thus, in certain embodiments, the organic emission layer 130 may be thinner than a general organic emission layer formed such that a blue layer is disposed above a green layer and a red layer. As a result, the organic emission layer 130 does not need to use an excess amount of energy and thus thermal degradation of an organic material constituting the organic emission layer 130 may be prevented.

FIG. 1 illustrates embodiments where the electron accepting layer 125 is disposed on the third organic emission layer 133 in the first sub-pixel SP1 and the second sub-pixel SP2. In certain embodiments, the electron accepting layer 125 may include at least one of 7,7,8,8-tetracyanoquinodimethane (TCNQ), tetrafluorotetracyanoquinodimethane (F4-TCNQ), hexaazatriphenylene hexacarbonitrile (HAT-CN), $MoO_3$, $V_2O_5$, $WO_3$, $SnO_2$, ZnO, $MnO_2$, $CoO_2$, $TiO_2$, and fullerene ($C_{60}$). For example, the electron accepting layer 125 may include 1,4,5,8,9,11-HAT-CN.

In certain embodiments, the thickness of the electron accepting layer 125 may be in the range of about 10 Å to about 100 Å. When the thickness of the electron accepting layer 125 is within this range, there may be no substantial increase in driving voltage and surplus electrons after the recombination of electrons and holes may be appropriately trapped.

FIG. 1 illustrates embodiments where the first organic emission layer 131 is formed on the electron accepting layer 125 in the first sub-pixel SP1. In certain embodiments, the first organic emission layer 131 may emit red visible light and include tetraphenylnaphthacene (rubrene), tris(1-phenylisoquinoline)iridium(III) ($Ir(piq)_3$), bis(2-benzo[b]thiophene-2-yl-pyridine)(acetylacetonate)iridium(III) ($Ir(btp)_2(acac)$), tris(dibenzoylmethan)phenanthroline europium(III) ($Eu(dbm)_3(phen)$), tris[4,4'-di-tert-butyl-(2,2')-bipyridine]ruthenium(III) complex ($Ru(dtb-bpy)_3*2(PF_6)$), 4-(dicyanomethylene)-6-methyl-2-[2-(4-dimethylaminophenyl)ethenyl]-4H-pyran (DCM1), 4-dicyanomethylene-2-methyl-6-[2-(2,3,6,7-tetrahydro-1H,5Hbenzo[i,j]quinolizin-8-yl)vinyl]-4H-pyran (DCM2), Eu(thenoyltrifluoroacetone)3 (Eu(TTA)3), or butyl-6-(1,1,7,7-tetramethyl julolydyl-9-enyl)-4H-pyran) (DCJTB), and may further include a polymer light-emitting material such as a polyfluorene-based polymer or a polyvinyl-based polymer.

FIG. 1 illustrates embodiments where the second organic emission layer 132 is formed on the electron accepting layer 125 in the second sub-pixel SP2. In certain embodiments, the second organic emission layer 132 may include a green light-emitting material such as 3-(2-benzothiazolyl)-7-(diethylamino)coumarin (Coumarin 6 2,3,6,7-tetrahydro-1,1,7,7-tetramethyl-1H,5H,11H-10-(2-benzothiazolyl)quinolizino-[9,9a,1gh]coumarin (C545T), N,N'-dimethyl-quinacridone (DMQA), or tris(2-phenylpyridine)iridium(III) ($Ir(ppy)_3$), and may further include a polymer light-emitting material such as a polyfluorene-based polymer or a polyvinyl-based polymer.

In certain embodiments, the thickness of the organic emission layer 130 may be in the range of about 200 Å to about 800 Å. When the thickness of the organic emission layer 130 is within the range described above, excellent light-emitting properties may be obtained without a substantial increase in driving voltage. FIG. 1 illustrates embodiments where an electron transport layer (ETL) 141 and an electron injection layer (EIL) 142 are sequentially formed on the organic emission layer 130 completely across all of the first sub-pixel SP1, the second sub-pixel SP2, and the third sub-pixel SP3, but are not limited thereto. For example, the ETL 141 and the EIL 142 may not be formed, only one of the two layers may be formed, or a plurality of electron transport layers and a plurality of electron injection layers may be formed.

In certain embodiments, a material for the ETL 141 may be, but is not limited to, a known electron transport material selected from a quinoline derivative such as tris(8-quinolinolate)aluminum ($Alq_3$), TAZ, Balq, and beryllium bis(benzoquinolin-10-olate ($Bebq_2$).

In certain embodiments, the thickness of the ETL 141 may be in the range of about 200 Å to about 500 Å. When the thickness of the ETL 141 is within the range described above, satisfactory electron transport properties may be obtained without a substantial increase in driving voltage.

In certain embodiments, a material for the EIL 142 may be a known electron injection layer-forming material such as LiF, NaCl, CsF, $Li_2O$, or BaO.

In certain embodiments, the thickness of the EIL 142 may be in the range of about 1 Å to about 20 Å. When the thickness of the EIL 142 is within the range described above, satisfactory electron injection properties may be obtained without a substantial increase in driving voltage.

FIG. 1 illustrates embodiments where the second electrode 150 is disposed on the EIL 142. In certain embodiments, the second electrode 150 may be a transparent electrode or a reflective electrode. When the second electrode 150 is formed as a transparent electrode, a metal having a low work function such as Ag, Mg, Al, Pt, Pd, Au, Ni, Nd, Ir, Cr, Li, or Ca, or combinations thereof is deposited on the EIL 142, and then an auxiliary electrode layer or a bus electrode line, which is formed of a transparent conductive material such as indium tin oxide (ITO), indium zinc oxide (IZO), ZnO or $In_2O_3$, may be formed on the metal.

In certain embodiments, the second electrode 150 may be formed of a metal having a low work function such as Ag, Mg, Al, Pt, Pd, Au, Ni, Nd, Ir, Cr, Li, or Ca when the second electrode 150 is formed as a reflective electrode.

In certain embodiments, a sealing member (not shown) may be disposed on the second electrode 150 so as to face the substrate 101. In certain embodiments, the sealing member may be formed to protect an organic emission layer from external moisture and oxygen and may be formed of a transparent material. For this purpose, the sealing member may be formed of glass, plastic, or a stacked structure including a plurality of layers formed of organic or inorganic materials.

FIG. 1 illustrates embodiments where the electron accepting layer 125 is disposed between the third organic emission layer 133 and the first organic emission layer 131 of the first sub-pixel SP1 and between the third organic emission layer 133 and the second organic emission layer 132 of the second sub-pixel SP2 in the organic light-emitting display apparatus 100.

In certain embodiments, the electron accepting layer 125 prevents electrons injected through the second electrode 150 from passing through the first organic emission layer 131, the second organic emission layer 132, and the third organic emission layer 133 and from entering the HTL 122 and the HIL 121.

In certain embodiments, during operation the organic light-emitting display apparatus 100, the electron accepting layer 125 traps surplus electrons, thereby preventing the surplus electrons from moving toward the third organic emission layer 133 or the HTL 122 after the electrons injected through the second electrode 150 in the first sub-pixel SP1 recombine with holes in the first organic emission layer 131. Also, in certain embodiments, the electron accepting layer 125 traps surplus electrons, thereby preventing the surplus electrons from moving toward the third organic emission layer 133 or the HTL 122 after electrons recombine with holes in the second organic emission layer 132 of the second sub-pixel SP2.

If surplus electrons enter an undesired organic layer, for example, the third organic emission layer 133, the HIL 121, or the HTL 122, the lifetime of the organic light-emitting display apparatus 100 may be reduced. However, FIG. 1 illustrates embodiments where surplus electrons may be trapped by the electron accepting layer 125, and thus the lifetime of the organic light-emitting display apparatus 100 may be improved.

The lifetime of an organic light-emitting display apparatus 100 may be further reduced due to surplus electrons. However, FIG. 1 illustrates embodiments where the electron accepting layer 125 may effectively prevent a reduction in the lifetime of the organic light-emitting display apparatus 100 where the first organic emission layer 131 and the second organic emission layer 132 are disposed closer to the second electrode 150 than the third organic emission layer 133.

FIG. 1 illustrates embodiments to overcome issues of surplus electrons recombining with holes to produce mixed visible light, not a desirable green visible light.

The color mixture of visible light may remarkably deteriorate image quality of an organic light-emitting display apparatus. However, FIG. 1 illustrates embodiments where the electron accepting layer 125 is disposed between the first organic emission layer 131 and the third organic emission layer 133 and between the second organic emission layer 132 and the third organic emission layer 133, so as to trap surplus electrons, thereby preventing the color mixture of the visible light, and, as a result, the image quality of the organic light-emitting display apparatus 100 may be improved.

In the organic light-emitting display apparatus 100, the HTL 122 is disposed between the first electrode 125 and the organic emission layer 130. In certain embodiments, the third organic emission layer 133 may include a blue host and a dopant, in addition to a first material having a hole transporting ability.

FIG. 1 illustrates embodiments where the organic light-emitting display apparatus 100 has a structure in which the third organic emission layer 133 as a common layer is disposed closer to the first electrode 110 and thus has a longer lifetime than that of an organic light-emitting display apparatus having a structure in which the common layer is disposed closer to a second electrode, while the third organic emission layer 133 has increased bulk resistance. If the bulk resistance of the third organic emission layer 133 increases, the driving voltage increases and power consumption may be reduced, accordingly.

In certain embodiments, the third organic emission layer 133 as a common layer includes the blue host and the dopant as well as the first material having a hole transporting ability and may have reduced bulk resistance.

In certain embodiments, the HTL 122 may contact the third organic emission layer 133 and acts as an intermediate connector, thereby more efficiently reducing the bulk resistance of the third organic emission layer 133.

In addition, in certain embodiments, a distance between the first electrode 110 and the second electrode 150 is different in each sub-pixel, so that an optical path length of visible light generated from the organic emission layer 130 may be different in each sub-pixel, thereby obtaining microcavity effects.

Figure 2:
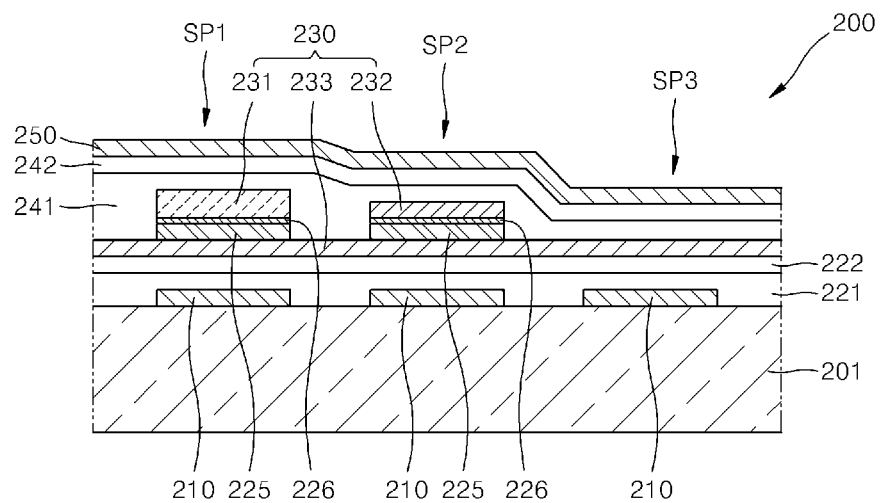
FIG. 2 is a schematic cross-sectional view of an organic light-emitting display apparatus according to another aspect of the present embodiments.

FIG. 2 is a schematic cross-sectional view of an organic light-emitting display apparatus 200 according to another embodiment of the present invention. For convenience of explanation, a detailed description of elements different from those of the aforementioned embodiments will be provided herein.

The organic light-emitting display apparatus 200 includes a first sub-pixel SP1, a second sub-pixel SP2, and a third sub-pixel SP3. In certain embodiments, the sub-pixels SP1, SP2, and SP3 may be different in color, and the first sub-pixel SP1, the second sub-pixel SP2, and the third sub-pixel SP3 may be defined as a red sub-pixel, a green sub-pixel, and a blue sub-pixel, respectively.

Although one first sub-pixel SP1, one second sub-pixel SP2, and one third sub-pixel SP3 are illustrated in FIG. 2, this is only for convenience of explanation and not limited to the above embodiments. For example, the organic light-emitting display apparatus 200 may include a plurality of first sub-pixels SP1, a plurality of second sub-pixels SP2, and a plurality of third sub-pixels SP3.

FIG. 2 illustrates embodiments where the first sub-pixel SP1 includes a first electrode 210, a HTL 222, a third organic emission layer 233, an electron accepting layer 225, a buffer layer 226, a first organic emission layer 231, and a second electrode 250 that are sequentially stacked. The second sub-pixel SP2 includes a first electrode 210, the HTL 222, the third organic emission layer 233, an electron accepting layer 225, a buffer layer 226, a second organic emission layer 232, and the second electrode 150. The third sub-pixel SP3 includes a first electrode 210, the HTL 222, the third organic emission layer 233, and the second electrode 250.

FIG. 2 illustrates embodiments where the first electrode 210 is formed on a substrate 201. Components of the substrate 201 and the first electrode 210 are the same as those of the aforementioned embodiments, and thus a detailed description thereof will not be provided herein.

FIG. 2 illustrates embodiments where a HIL 221 and a HTL 222 are formed on the first electrode 210, but are not limited thereto. For example, only the HTL 222 may be disposed without the HIL 221, and a plurality of hole transport layers 222 may be disposed.

In certain embodiments, the HTL 222 may include a known hole transporting material. A detailed description of material for HTL 222 is already provided above.

FIG. 2 illustrates embodiments where an organic emission layer 230 is formed on the HTL 222. For example, the HTL 222 and the third organic emission layer 233 may be disposed in contact with each other.

FIG. 2 illustrates embodiments where the organic emission layer 230 includes the first organic emission layer 231, the second organic emission layer 232, and the third organic emission layer 233. In particular, the third organic emission layer 233 is formed on the HTL 222 completely across all of the first sub-pixel SP1, the second sub-pixel SP2, and the third sub-pixel SP3.

In certain embodiments, the third organic emission layer 233 may include a first material having a hole transporting ability, a blue host, and a dopant and may emit blue visible light. A detailed description of these materials is already provided above.

In the first sub-pixel SP1 and the second sub-pixel SP2, the buffer layer 226 and the electron accepting layer 225 are disposed on the third organic emission layer 233. In particular, the buffer layer 226 is disposed between the first organic emission layer 231 and the electron accepting layer 225.

In certain embodiments, the electron accepting layer 225 may include at least one of TCNQ, F4-TCNQ, HAT-CN, $MoO_3$, $V_2O_5$, $WO_3$, $SnO_2$, ZnO, $MnO_2$, $CoO_2$, $TiO_2$, and fullerene ($C_{60}$). For example, the electron accepting layer 225 may include 1,4,5,8,9,11-HAT-CN.

In certain embodiments, the buffer layer 226 includes a hole transporting material or a hole injection material.

In certain embodiments, the thickness of the buffer layer 226 may be in the range of about 100 Å to about 700 Å. When the thickness of the buffer layer 226 is within this range, the amount of electrons trapped by the electron accepting layer 225 may be efficiently controlled.

FIG. 2 illustrates embodiments where the first organic emission layer 231 is formed on the buffer layer 226 in the first sub-pixel SP1. In certain embodiments, the first organic emission layer 231 emits red visible light, and a detailed description of materials thereof is already provided in the aforementioned embodiments.

FIG. 2 illustrates embodiments where the second organic emission layer 232 is formed on the buffer layer 226 in the second sub-pixel SP2. In certain embodiments, the second organic emission layer 232 emits green visible light and a detailed description of materials thereof is already provided in the aforementioned embodiment.

FIG. 2 illustrates embodiments where an ETL 241 and an EIL 242 are sequentially disposed on the organic emission layer 230 in the first, second and third sub-pixels SP1, SP2 and SP3, but are not limited thereto. In certain embodiments, the ETL 241 and the EIL 242 may not be disposed, or only one of the two layers may be disposed.

FIG. 2 illustrates embodiments where the second electrode 250 is disposed on the electron injection layer 242. A sealing member (not shown) may be disposed on the second electrode 250. A detailed description of the second electrode 250 and the sealing member is already provided in the aforementioned embodiment and thus is not provided herein.

In the organic light-emitting display apparatus 200 illustrated in FIG. 2 embodiments, the electron accepting layer 225 is disposed between the third organic emission layer 233 and the first organic emission layer 231 of the first sub-pixel SP1 and between the third organic emission layer 233 and the second organic emission layer 232 of the second sub-pixel SP2. Surplus electrons are trapped in the electron accepting layer 225, and thus the lifetime of the organic light-emitting display apparatus 200 may be improved. In addition, in the first sub-pixel SP1 and the second sub-pixel SP2, the electron accepting layer 225 prevents surplus electrons from recombining with holes in the third organic emission layer 233 and thus prevents light from being emitted so as to prevent color mixture, and, as a result, the image quality of the organic light-emitting display apparatus 200 may be improved.

Advantageously, the buffer layer 226 enhances such an effect. That is, electrons injected through the second electrode 250 in the first sub-pixel SP1 may recombine with holes in the first organic emission layer 231, thereby emitting red visible light. In this regard, the number of electrons that contribute to the recombination in the first organic emission layer 231 may be reduced due to the electron accepting layer 225.

In certain embodiments, the buffer layer 226 may be disposed between the first organic emission layer 231 and the electron accepting layer 225 so as to control electrons moving from the first organic emission layer 231 to the electron accepting layer 225. Thus, the recombination efficiency between electrons and holes in the first organic emission layer 231 may be improved.

Therefore, FIG. 2 illustrates embodiments where the organic light-emitting display apparatus 200 may have improved image quality and lifetime.

In certain embodiments, the third organic emission layer 233 may include a blue host and a dopant as well as a hole transporting material and thus may have reduced bulk resistance. In certain embodiments, the HTL 222 may contact the third organic emission layer 233 and act as an intermediate connector, and thus the HTL 222 may more efficiently reduce the bulk resistance of the third organic emission layer 233.

In certain embodiments, a distance between the first electrode 210 and the second electrode 250 is different in each sub-pixel, so that an optical path length of visible light generated from the organic emission layer 230 may be different in each sub-pixel, thereby obtaining microcavity effects.

Figure 3:
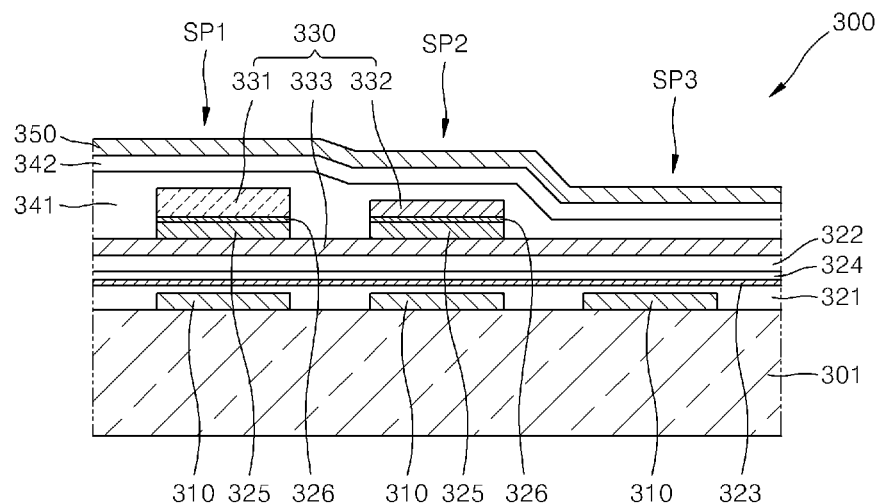
FIG. 3 is a schematic cross-sectional view of an organic light-emitting display apparatus according to another aspect of the present embodiments.

FIG. 3 is a schematic cross-sectional view of an organic light-emitting display apparatus 300 according to another aspect of the present embodiments. For convenience of explanation, a detailed description of elements different from those of the aforementioned embodiment will be provided herein.

FIG. 3 illustrates embodiments where the organic light-emitting display apparatus 300 includes a first sub-pixel SP1, a second sub-pixel SP2, and a third sub-pixel SP3. In certain embodiments, the sub-pixels SP1, SP2, and SP3 may be different in color, and the first sub-pixel SP1, the second sub-pixel SP2, and the third sub-pixel SP3 may be defined as a red sub-pixel, a green sub-pixel, and a blue sub-pixel, respectively.

Although one first sub-pixel SP1, one second sub-pixel SP2, and one third sub-pixel SP3 are illustrated in FIG. 3, this is only for convenience of explanation and not limited to the above example. For example, the organic light-emitting display apparatus 300 may include a plurality of first sub-pixels SP1, a plurality of second sub-pixels SP2, and a plurality of third sub-pixels SP3.

FIG. 3 illustrates embodiments where the first sub-pixel SP1 includes a first electrode 310, an intermediate layer 323, a HTL 322, a third organic emission layer 333, an electron accepting layer 325, a buffer layer 326, a first organic emission layer 331, and a second electrode 350. FIG. 3 illustrates embodiments where the second sub-pixel SP2 includes a first electrode 310, an intermediate layer 323, the HTL 322, the third organic emission layer 333, an electron accepting layer 325, a buffer layer 326, a second organic emission layer 332, and the second electrode 350. FIG. 3 illustrates embodiments where the third sub-pixel SP3 includes the intermediate layer 323, the HTL 322, a first electrode 310, the third organic emission layer 333, and the second electrode 350.

FIG. 3 illustrates embodiments where the first electrode 310 is formed on a substrate 301. Components of the substrate 301 and the first electrode 310 are the same as those of the aforementioned embodiments, and thus a detailed description thereof will not be provided herein.

FIG. 3 illustrates embodiments where a HIL 321 and the HTL 322 are formed on the first electrodes 310. Also, a plurality of hole injection layers 321 and a plurality of hole transport layers 322 may be disposed.

A detailed description of materials for the HIL 321 and the HTL 322 is already provided above.

FIG. 3 illustrates embodiments where the intermediate layer 323 is disposed between the HIL 321 and the HTL 322. In certain embodiments, the intermediate layer 323 may include at least one of component selected from the group consisting of TCNQ, F4-TCNQ, HAT-CN, $MoO_3$, $V_2O_5$, $WO_3$, $SnO_2$, ZnO, $MnO_2$, $CoO_2$, $TiO_2$, and fullerene ($C_{60}$). For example, the intermediate layer 323 may include 1,4,5, 8,9,11-HAT-CN.

In certain embodiments, the TCNQ, F4-TCNQ, HAT-CN, $MoO_3$, $V_2O_5$, $WO_3$, $SnO_2$, ZnO, $MnO_2$, $CoO_2$, $TiO_2$, and fullerene ($C_{60}$) of the intermediate layer 323 are capable of trapping electrons and have excellent hole transporting abilities. In certain embodiments, the intermediate layer 323 is disposed between the HIL 321 and the HTL 322 so as to easily transfer holes injected through the first electrode 310 to an organic emission layer 330.

FIG. 3 illustrates embodiments where an auxiliary layer 324 including a hole transporting material or a hole injection material may be further disposed between the intermediate layer 323 and the HTL 322.

FIG. 3 illustrates embodiments where the organic emission layer 330 is formed on the HTL 322. For example, the HTL 322 and the third organic emission layer 333 may be disposed in contact with each other.

FIG. 3 illustrates embodiments where the organic emission layer 330 includes the first organic emission layer 331, the second organic emission layer 332, and the third organic emission layer 333.

In particular, FIG. 3 illustrates embodiments where, the third organic emission layer 333 is formed on the HTL 322 completely across all of the first sub-pixel SP1, the second sub-pixel SP2, and the third sub-pixel SP3.

In certain embodiments, the third organic emission layer 333 may include a first material having a hole transporting ability, a blue host, and a dopant and emits blue visible light. A detailed description of these materials is already provided above.

In certain embodiments, the buffer layer 326 and the electron accepting layer 325 are disposed on the third organic emission layer 333 in the first sub-pixel SP1 and the second sub-pixel SP2.

In certain embodiments, the electron accepting layer 325 may include at least one of TCNQ, F4-TCNQ, HAT-CN, $MoO_3$, $V_2O_5$, $WO_3$, $SnO_2$, ZnO, $MnO_2$, $CoO_2$, $TiO_2$, and fullerene ($C_{60}$). For example, the electron accepting layer 325 may include 1,4,5,8,9,11-HAT-CN.

In certain embodiments, the buffer layer 326 may include a hole transporting material or a hole injection material.

FIG. 3 illustrates embodiments where the first organic emission layer 331 is formed on the buffer layer 326 in the first sub-pixel SP1. In certain embodiments, the first organic emission layer 331 emits red visible light, and a detailed description of a material for the first organic emission layer 331 is already provided above.

FIG. 3 illustrates embodiments where the second organic emission layer 332 is formed on the buffer layer 326 in the second sub-pixel SP2. In certain embodiments, the second organic emission layer 332 emits green visible light and a detailed description of a material for the second organic emission layer 332 is already provided above.

FIG. 3 illustrates embodiments where an electron transport layer (ETL) 341 and an electron injection layer (EIL) 342 are sequentially disposed on the organic emission layer 330 completely across all of the first sub-pixel SP1, the second sub-pixel SP2, and the third sub-pixel SP3; however, the present invention is not limited thereto. For example, the ETL 341 and the EIL 342 may not be disposed, or only one of the two layers may be disposed.

FIG. 3 illustrates embodiments where the second electrode 350 is disposed on the EIL 342. In certain embodiments, a sealing member (not shown) may be disposed on the second electrode 350. A detailed description of the second electrode 350 and the sealing member is already provided above.

FIG. 3 illustrates embodiments where the electron accepting layer 325 is disposed between the third organic emission layer 333 and the first organic emission layer 331 of the first sub-pixel SP1 and between the third organic emission layer 333 and the second organic emission layer 332 of the second sub-pixel SP2. In certain embodiments, the electron accepting layer 325 traps surplus electrons so that the organic light-emitting display apparatus 300 has improved lifetime. In addition, color mixing may be prevented and the image quality of the organic light-emitting display apparatus 300 may be improved. In certain embodiments, including the buffer layer 326 may further improve the image quality and lifetime of the organic light-emitting display apparatus 300.

In certain embodiments, the third organic emission layer 333 includes a blue host and a dopant as well as a first material having a hole transporting ability and thus may have reduced bulk resistance. In certain embodiments, the HTL 322 may contact the third organic emission layer 333 and act as an intermediate connector, and thus the HTL 322 may more efficiently reduce the bulk resistance of the third organic emission layer 333.

In certain embodiments, the intermediate layer 323 may be formed of the same material as that of the electron accepting layer 325 disposed between the HIL 321 and the HTL 322. In certain embodiments, hole transport efficiency may be improved by inclusion of the intermediate layer 323.

In certain embodiments, the thickness of the intermediate layer 323 may be in the range of about 10 Å to about 80 Å. When the thickness of the intermediate layer 323 is within this range, the recombination efficiency between electrons and holes in the organic emission layer 330 may be improved and thus the organic light-emitting display apparatus 300 may have improved optical efficiency.

In addition, an optical path length of visible light may be different in each sub-pixel, thereby obtaining microcavity effects.

Figure 4:
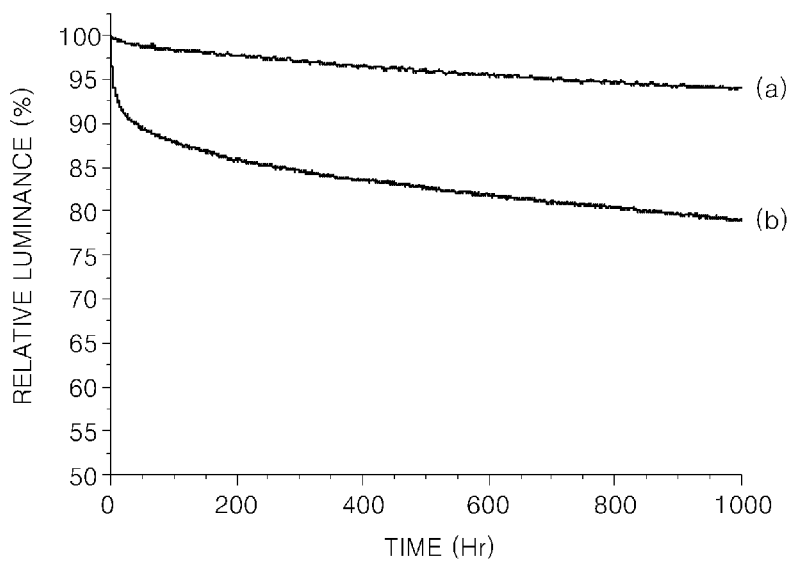
FIG. 4 is a graph showing a lifetime of an organic light-emitting display apparatus according to an aspect of the present embodiments.

FIG. 4 is a graph illustrating a lifetime of an organic light-emitting display apparatus according to an aspect of the present embodiments. In particular, FIG. 4 illustrates a relative luminance of the organic light-emitting display apparatus according to time. In this regard, the relative luminance is an indicator representing a lifetime of an organic light-emitting display apparatus and is a ratio of luminance at each time to an initial luminance. In FIG. 4, (a) is an example of the organic light-emitting display apparatus according to the present embodiments, and (b) is an example of a conventional organic light-emitting display apparatus not including an electron accepting layer.

Referring to (a) of FIG. 4, even after the organic light-emitting display apparatus is continuously used for 1,000 hours, the relative luminance is approximately 95%. That is, even after 1,000 hours, the luminance is reduced by about 5% as compared to the initial luminance. Referring to (b) of FIG. 4, even after the organic light-emitting display apparatus is continuously used for 1,000 hours, the relative luminance is approximately 80%. That is, even after 1,000 hours, the luminance was reduced by about 20% as compared to the initial luminance.

As illustrated in FIG. 4, the organic light-emitting display apparatus according to the present embodiments exhibits a small reduction in luminance according to time and thus has significantly improved lifetime.

Table 1 below shows driving voltages, current densities, luminances, luminous efficiencies and power consumption of the organic light-emitting display apparatus according to the present embodiments ((a)), a conventional organic light-emitting display apparatus not including an electron accepting layer ((b)), and an organic light-emitting display apparatus including an electron accepting layer and a common layer that includes only a blue host and a dopant but not includes a hole transporting material ((c)).

TABLE 1

| Organic light-emitting display apparatus | Driving voltage (V) | Current density (mA/cm$^2$) | luminance (W/B 400 nit) | Luminous efficiency (Cd/A) | Power consumption (lm/W) |
| --- | --- | --- | --- | --- | --- |
| (a) | 4.20 | 8.83 | 5000 | 56.20 | 42.09 |
| (b) | 4.91 | 8.92 | 5000 | 55.96 | 35.82 |
| (c) | 5.71 | 9.56 | 5000 | 52.33 | 28.81 |

Referring to Table 1, the (a) apparatus has a lower driving voltage and higher luminous efficiency than those of the comparative (b) and (c) apparatuses.

As shown in Table 1, the organic light-emitting display apparatus according to the present embodiments has a low driving voltage and improved luminous efficiency.

As described above, according to the present embodiments, the image quality and lifetime of an organic light-emitting display apparatus may be easily improved.

Although exemplary embodiments have been described for illustrative purposes, those skilled in the art will appreciate that various modifications, additions and substitutions are possible without departing from the spirit and scope of the present embodiments as defined by the following claims. The exemplary embodiments should be considered in a descriptive sense only and not for purposes of limitation. Therefore, the scope of the present embodiments is defined not by the detailed description but by the following claims, and all differences within the scope will be construed as being included in the present embodiments.

What is claimed is:

1. An organic light-emitting display apparatus comprising a first sub-pixel, a second sub-pixel, and a third sub-pixel that are different in color from each other, the apparatus comprising:
   a substrate;
   a first electrode disposed on the substrate;
   a second electrode disposed on the first electrode so as to face the first electrode;
   an organic emission layer disposed between the first electrode and the second electrode and comprising a first organic emission layer, a second organic emission layer, and a third organic emission layer;
   a hole transport layer disposed between the first electrode and the organic emission layer; and
   an electron accepting layer disposed between the first electrode and the second electrode so as to contact the organic emission layer,
   wherein the first organic emission layer is disposed in the first sub-pixel, the second organic emission layer is disposed in the second sub-pixel, and the third organic emission layer is commonly disposed across all of the first sub-pixel, the second sub-pixel, and the third sub-pixel,
   wherein the electron accepting layer is disposed between the first organic emission layer and the third organic emission layer in the first sub-pixel and between the second organic emission layer and the third organic emission layer in the second sub-pixel,
   wherein the third organic emission layer comprises a first material having a hole transporting ability, a blue host, and a dopant, and
   wherein the third sub-pixel does not comprise the electron accepting layer.

2. The organic light-emitting display apparatus of claim 1, wherein the first organic emission layer is configured to emit red visible light, the second organic emission layer is configured to emit green visible light, and the third organic emission layer is configured to emit blue visible light.

3. The organic light-emitting display apparatus of claim 1, wherein the electron accepting layer comprises at least one component selected from the group consisting of 7,7,8,8-tetracyanoquinodimethane (TCNQ), tetrafluorotetracyanoquinodimethane (F4-TCNQ), hexaazatriphenylene hexacarbonitrile (HAT-CN), $MoO_3$, $V_2O_5$, $WO_3$, $SnO_2$, ZnO, $MnO_2$, $CoO_2$, $TiO_2$, and fullerene ($C_{60}$).

4. The organic light-emitting display apparatus of claim 1, wherein the electron accepting layer has a thickness in a range of 10 Å to 100 Å.

5. The organic light-emitting display apparatus of claim 1, wherein the first material comprises a hole transporting material.

6. The organic light-emitting display apparatus of claim 1, wherein the third organic emission layer comprises 100 parts by weight of the first material, 10 to 100 parts by weight of the blue host, and 3 to 10 parts by weight of the dopant.

7. The organic light-emitting display apparatus of claim 1, wherein the hole transport layer contacts the third organic emission layer.

8. The organic light-emitting display apparatus of claim 1, wherein the hole transport layer has a thickness in a range of 100 Å to 800 Å.

9. The organic light-emitting display apparatus of claim 1, wherein the third organic emission layer is disposed between the first electrode and the first organic emission layer in the first sub-pixel and between the first electrode and the second organic emission layer in the second sub-pixel.

10. The organic light-emitting display apparatus of claim 1, further comprising a buffer layer between the electron accepting layer and the first organic emission layer in the first sub-pixel and between the electron accepting layer and the second organic emission layer in the second sub-pixel.

11. The organic light-emitting display apparatus of claim 10, wherein the buffer layer comprises a hole injection material or a hole transporting material.

12. The organic light-emitting display apparatus of claim 10, wherein the buffer layer has a thickness in a range of 100 Å to 700 Å.

13. The organic light-emitting display apparatus of claim 1, wherein a hole injection layer is disposed between the substrate and the hole transport layer.

14. The organic light-emitting display apparatus of claim 13, further comprising an intermediate layer disposed between the hole injection layer and the hole transport layer.

15. The organic light-emitting display apparatus of claim 14, wherein the intermediate layer comprises at least one component selected from the group consisting of 7,7,8,8-tetracyanoquinodimethane (TCNQ), tetrafluorotetracyanoquinodimethane (F4-TCNQ), hexaazatriphenylene hexacarbonitrile (HAT-CN), $MoO_3$, $V_2O_5$, $WO_3$, $SnO_2$, ZnO, $MnO_2$, $CoO_2$, $TiO_2$, and fullerene ($C_{60}$).

16. The organic light-emitting display apparatus of claim 14, wherein the intermediate layer has a thickness in a range of 10 Å to 80 Å.

17. A flat display device comprising a transistor that comprises a source, a drain, a gate, and an active layer and the organic light-emitting display apparatus according to claim 1, wherein one of the source and the drain is electrically connected to a first electrode of the organic light-emitting display apparatus.

18. The organic light-emitting display apparatus of claim 1, wherein a distance between the first electrode and the second electrode is different in each sub-pixel.

* * * * *